United States Patent [19]
Kim

[11] Patent Number: 5,851,868
[45] Date of Patent: Dec. 22, 1998

[54] METHODS OF FORMING INTEGRATED DECOUPLING CAPACITORS

[75] Inventor: Sung-bong Kim, Kyungki-do, Rep. of Korea

[73] Assignee: Samsung Electronics Co., Ltd., Suwon, Rep. of Korea

[21] Appl. No.: 699,945

[22] Filed: Aug. 20, 1996

[30] Foreign Application Priority Data

Sep. 19, 1995 [KR] Rep. of Korea .................. 1995-30681

[51] Int. Cl.⁶ ............................................. H01L 21/8234
[52] U.S. Cl. ........................... 438/238; 438/250; 438/381
[58] Field of Search ................................... 438/238, 250, 438/393, 394, 381, 253–254, 391–396

[56] References Cited

U.S. PATENT DOCUMENTS 4,700,457 10/1987 Matsukawa .
5,350,705 9/1994 Brassington et al. .
5,439,840 8/1995 Jones, Jr. et al. .
5,472,900 12/1995 Vu et al. .
5,587,333 12/1996 Johansson et al. .

*Primary Examiner*—Jey Tsai
*Attorney, Agent, or Firm*—Myers Bigel Sibley & Sajovec

[57] ABSTRACT

Methods of forming decoupling capacitors include the steps of forming an insulated first capacitor electrode on a first portion of a face of a semiconductor substrate containing a region of first conductivity type therein extending to the first portion of the face. A second capacitor electrode is formed on the insulated first capacitor electrode, opposite the region of first conductivity type. Inversion-layer charge source regions of second conductivity type are formed in the region of first conductivity type, so that second conductivity type charges carriers can be supplied to the first portion of the face when the first capacitor electrode is appropriately biased. A first capacitor contact is formed to electrically contact the insulated first capacitor electrode and a second capacitor contact is also formed to electrically connect the second capacitor electrode to the inversion-layer charge source regions.

35 Claims, 13 Drawing Sheets

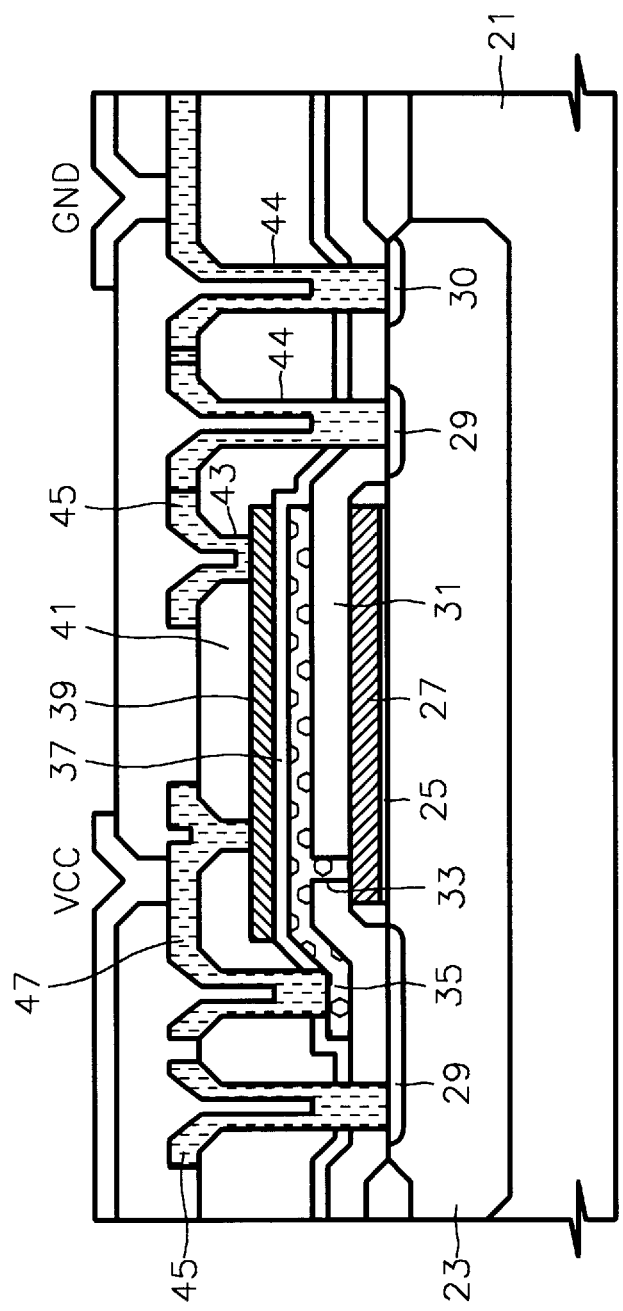

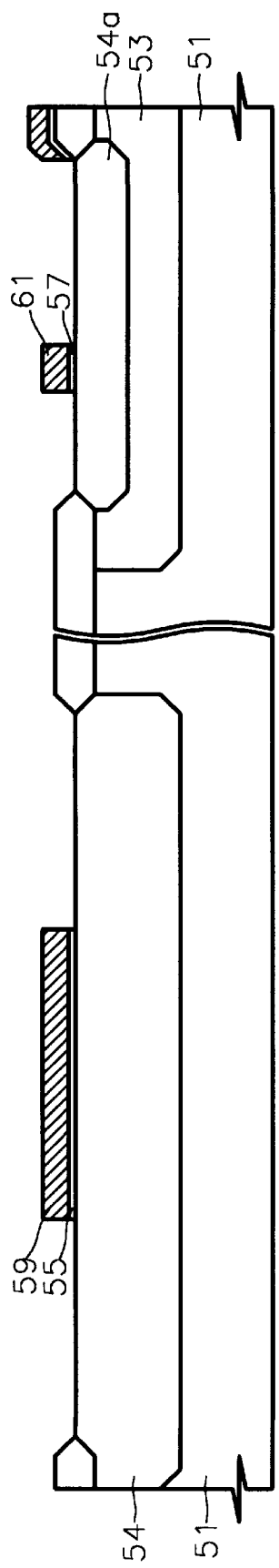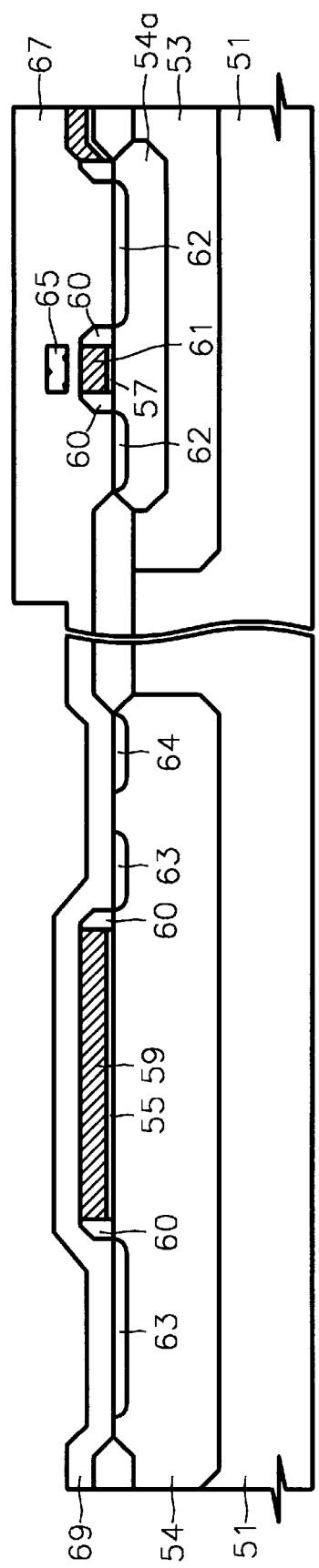

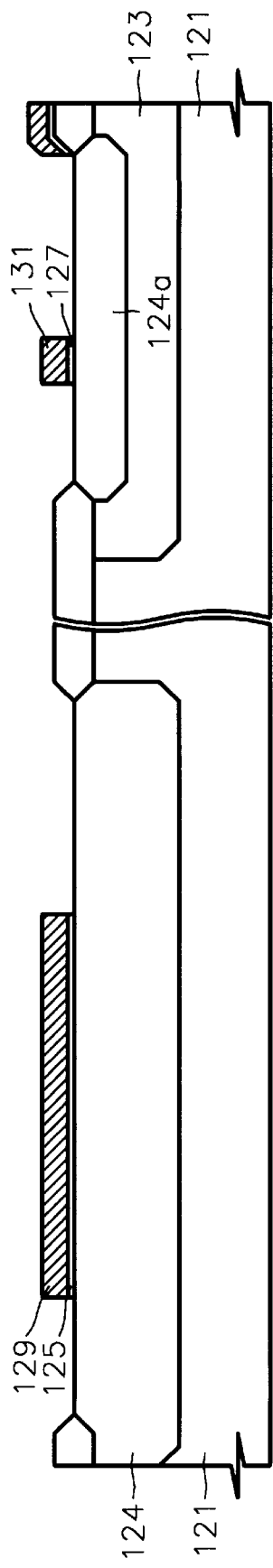
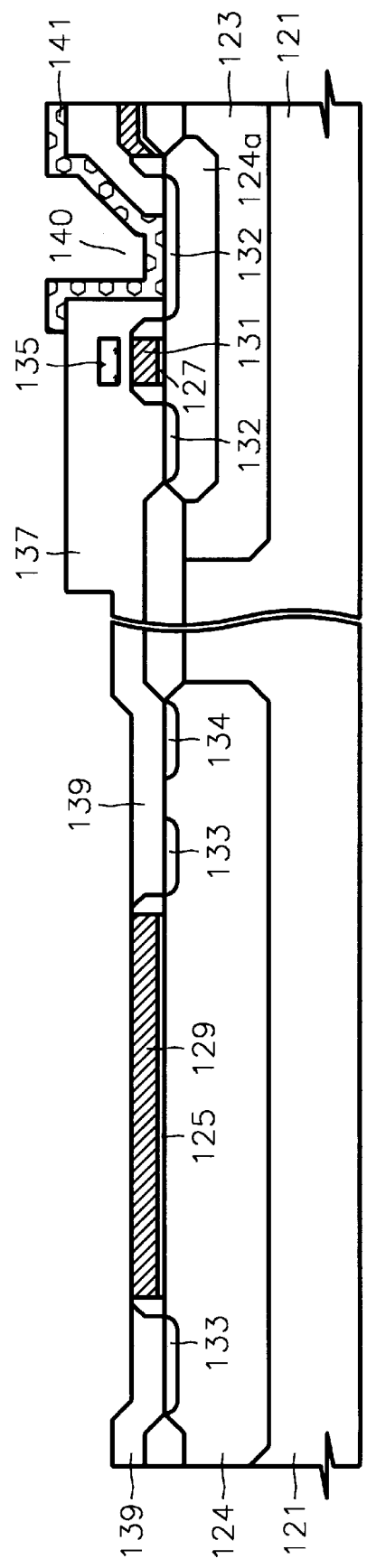

5,851,868

METHODS OF FORMING INTEGRATED DECOUPLING CAPACITORS

FIELD OF THE INVENTION

The present invention relates to semiconductor devices and methods of fabrication, and more particularly to decoupling capacitors and methods of forming decoupling capacitors.

BACKGROUND OF THE INVENTION

Because of the trend towards higher integration levels and higher switching speeds in integrated circuits, there has been a concomitant need to provide more sophisticated circuitry for powering the circuits and providing uniform power levels, even while supplying larger currents. Moreover, the power supplies of present day integrated circuits must also be capable of supplying large switching currents without a significant fall-off in the power supply voltage (e.g., VCC).

Because of the need to supply large switching currents, on-chip decoupling capacitors have been designed to store large quantities of charge. During high speed switching, this stored charge can be accessed to supply immediate current demands over relatively short time intervals. For example, FIG. 1 illustrates a prior art on-chip decoupling capacitor having an insulated capacitor electrode 7 which is separated from a P-type well region 3 by a dielectric layer 5. The well region 3 may be provided in an N-type or P-type semiconductor substrate 1. As illustrated, the insulated capacitor electrode 7 is electrically connected to the power supply signal line (VCC) and the well region 3 and P-type contact region 10 are electrically connected to the on-chip ground line 11 (GND). N-type charge source regions 9 are also provided to facilitate the formation of an inversion-layer of electrons at the face of the well region 3, opposite the insulated capacitor electrode 7.

However, the trend towards higher integration densities has limited the amount of surface area which can be consumed by such prior art capacitors. Thus, because the amount of stored charge, capacitance and surface area of the capacitor are all directly related, the trend towards higher integration densities is contrary to the trend of providing greater stored charge levels needed to supply large switching currents.

Thus, notwithstanding the above described prior art decoupling capacitor, there still continues to be a need for methods of forming decoupling capacitors capable of storing large quantities of charge, which are compatible with the trend towards higher integration densities.

SUMMARY OF THE INVENTION

It is therefore an object of the present invention to provide improved methods of forming decoupling capacitors on a semiconductor substrate, and decoupling capacitors formed thereby.

It is another object of the present invention to provide methods of forming highly integrated decoupling capacitors having large charge storage capability, and decoupling capacitors formed thereby.

It is still another object of the present invention to provide methods of forming decoupling capacitors which are compatible with methods of forming integrated circuits and do not require additional process steps, and decoupling capacitors formed thereby.

These and other objects, features and advantages of the present invention are provided by preferred integrated decoupling capacitors and methods of forming same as a plurality of vertically stacked capacitor electrodes opposite a semiconductor substrate which acts as an additional electrode. In particular, an insulated first capacitor electrode is provided on a face of the substrate and is preferably electrically insulated therefrom by a first dielectric layer. A first electrically insulating layer is provided on an upper surface of the first capacitor electrode and a second capacitor electrode is provided on the first electrically insulating layer, opposite the first capacitor electrode. A third capacitor electrode is also patterned opposite the second capacitor electrode and is separated therefrom by a second dielectric layer of predetermined dielectric material.

The third capacitor electrode is electrically insulated from upper levels of metallization by a second electrically insulating layer. A first capacitor contact (e.g., VCC) is also formed by patterning metallization in a first via which extends through the second electrically insulating layer, second dielectric layer and first electrically insulating layer to expose an upper surface of the first capacitor electrode. A fourth via is also provided so that the first and third capacitor electrodes can be connected together via the first capacitor contact. A second capacitor contact is also provided by patterning metallization in second and third vias. The third via extends through the second electrically insulating layer and second dielectric layer to expose an upper surface of the second capacitor electrode and the third via extends through the second electrically insulating layer, the second dielectric layer and the first electrically insulating layer to expose inversion-layer charge source regions of second conductivity type in the substrate. These charge source regions provide second conductivity type charge carriers to the portions of the substrate extending opposite the first capacitor electrode.

According to an alternative embodiment of the present invention, the decoupling capacitor includes a first dielectric layer, an insulated first capacitor electrode thereon, a second dielectric layer on an upper surface of the first capacitor electrode and a second capacitor electrode on the second dielectric layer. The second capacitor electrode is electrically insulated from upper levels of metallization by an electrically insulating layer. A first capacitor contact is also provided by patterning metallization in a via which extends through the electrically insulating layer and exposes an upper surface of the first capacitor electrode. A second capacitor contact is also provided by patterning metallization in a via which exposes an upper surface of the second capacitor electrode and in a via which exposes charge source regions. Based on the vertical or "stacked" arrangement of the first and second capacitor electrodes, the application of a predetermined potential bias to the first capacitor electrode causes (i) the formation of an inversion-layer channel of second conductivity type charge carriers (e.g., electrons) in the substrate and the formation of a density of second conductivity type charge carriers on the second capacitor electrode. Thus, the formation of the first and second capacitor electrodes in stacked vertical relationship essentially doubles the area and effective capacitance of the integrated decoupling capacitor, relative to prior art decoupling capacitors.

A preferred method of forming the above described decoupling capacitors includes the steps of forming an insulated first capacitor electrode on a first portion of a face of a semiconductor substrate containing a region of first conductivity type therein extending to the first portion of the face. A second capacitor electrode is then formed on the insulated first capacitor electrode, opposite the region of first conductivity type. Inversion-layer charge source regions of second conductivity type are then formed in the region of first conductivity type, so that second conductivity type charges carriers can be supplied to the first portion of the face when the first capacitor electrode is appropriately biased. A first capacitor contact is then formed to electrically contact the insulated first capacitor electrode and a second capacitor contact is also formed to electrically connect the second capacitor electrode to the inversion-layer charge source regions.

BRIEF DESCRIPTION OF THE DRAWINGS

FIG. 2 illustrates a schematic cross-sectional view of an integrated decoupling capacitor according to a first embodiment of the present invention.

FIGS. 3–9 illustrate schematic cross-sectional views of intermediate structures illustrating a method of forming the integrated decoupling capacitor of FIG. 2 and a static random-access memory cell.

FIGS. 12–16 illustrate schematic cross-sectional views of intermediate structures illustrating a method of forming the integrated decoupling capacitor of FIG. 11 and a static random-access memory cell.

DESCRIPTION OF PREFERRED EMBODIMENTS

Figure 1:
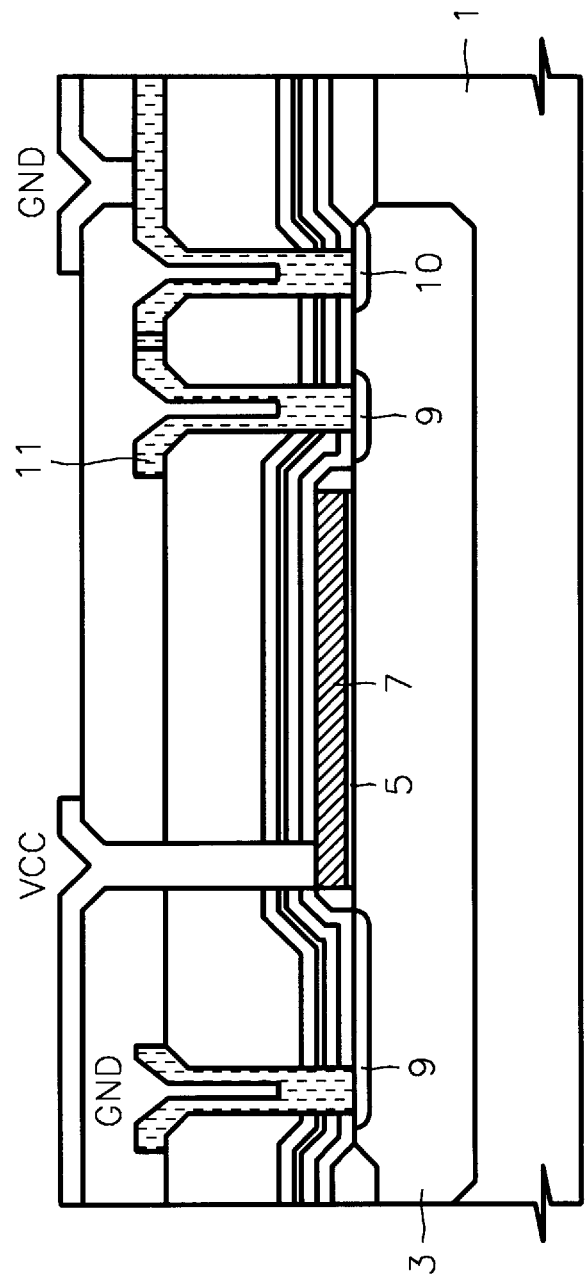
FIG. 1 illustrates a schematic cross-sectional view of a decoupling capacitor according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well.

Referring now to FIGS. 2–9, a method of simultaneously forming an integrated decoupling capacitor and static random-access memory (RAM) cell according to a first embodiment of the present invention, will be described. According to this first embodiment, an integrated decoupling capacitor comprises a semiconductor substrate 21 of first or second conductivity type and a diffused well region 23 of first conductivity type (e.g., P-type) therein extending to a first portion of a face of the semiconductor substrate 21, defined by an opening in a field oxide isolation region. An insulated first capacitor electrode 27 is provided on the first portion of the face. The first capacitor electrode 27 is preferably electrically insulated from the face by a first dielectric layer 25 of predetermined dielectric material. Exposed edges or ends of the first capacitor electrode 27 are also electrically insulated by sidewall spacers, as illustrated, and a first electrically insulating layer 31 is provided on an upper surface of the first capacitor electrode 27. As will be understood by those skilled in the art, the application of a predetermined potential bias to the first capacitor electrode 27 will cause the formation of an inversion-layer channel of second conductivity type charge carriers (e.g., electrons) in the region 23 of first conductivity type at the face, opposite the first capacitor electrode 27. These second conductivity type charge carriers are provided to the region 23 of first conductivity type by inversion-layer charge source regions 29 of second conductivity type. These inversion-layer charge source regions 29 are preferably self-aligned to the first capacitor electrode 27 by implanting and diffusing second conductivity type dopants into the face, using the first capacitor electrode 27 and sidewall spacers as an implant mask, as explained more fully hereinbelow.

Referring still to FIG. 2, a second capacitor electrode 35 is also provided on the first electrically insulating layer 31. To achieve high levels of integration, the second capacitor electrode 35 is patterned opposite the first capacitor electrode 27 and is electrically connected thereto through a first via or contact hole 33 therein. A third capacitor electrode 39 is also patterned opposite the second capacitor electrode 35 and is separated therefrom by a second dielectric layer 37 of predetermined dielectric material (e.g., $SiO_2$, $Si_3N_4$). The third capacitor electrode 39 is electrically insulated from upper levels of metallization by a second electrically insulating layer 41. A first capacitor contact 47 (e.g., VCC) is also provided by patterning metallization in a second via which extends through the second electrically insulating layer 41 and exposes an upper surface of the second capacitor electrode 35. A second capacitor contact 45 (e.g., GND) is also provided by patterning metallization in third and fourth vias 43 and 44, respectively. Here, the third via 43 extends through the second electrically insulating layer 41 to expose an upper surface of the third capacitor electrode 39 and the fourth via 44 extends through the second electrically insulating layer 41, the second dielectric layer 37 of predetermined dielectric material and the first electrically insulating layer 31 to expose the inversion-layer charge source regions 29 of second conductivity type. To prevent the region 23 of first conductivity type from "floating", a first conductivity type contact region 30 is also provided therein. As illustrated, metallization is also patterned in the fourth via 44 to electrically connect the first conductivity type contact region 30 to the second capacitor contact 45.

Based on the illustrated vertical or "stacked" arrangement of the first, second and third capacitor electrodes, the application of a predetermined potential bias to the first and second capacitor electrodes 27 and 35 will cause (i) the formation of an inversion-layer channel of second conductivity type charge carriers (e.g., electrons) in the region 23 of first conductivity type at the face, opposite the first capacitor electrode 27; and (ii) the formation of a density of second conductivity type charge carriers on the third capacitor electrode 39, if the second capacitor contact 45 is maintained at ground potential (GND), as illustrated. Thus, the formation of the first, second and third capacitor electrodes in stacked vertical relationship, as illustrated, essentially doubles the area and effective capacitance of the integrated decoupling capacitor, relative to the prior art decoupling capacitor of FIG. 1. Moreover, as explained more fully hereinbelow, the decoupling capacitor of FIG. 2 can be formed simultaneously with the formation of active devices of an integrated circuit such as a memory cell, without requiring additional process steps.

The preferred steps of forming the decoupling capacitor of FIG. 2 in conjunction with a static random-access memory cell, will now be described. In particular, FIG. 3 illustrates the steps of forming diffused well regions 54, 54a of first conductivity type at separate spaced locations in a semiconductor substrate 51 of first or second conductivity type. These well regions 54, 54a may be formed by implanting and diffusing first conductivity type dopants into a face of the semiconductor substrate 51, using a previously formed field oxide isolation region as an implant mask. As illustrated, the diffused well region 54a of first conductivity type may be formed by implanting and diffusing dopants of first conductivity type into a well region 53 of second conductivity type, at an exposed portion of the face of the substrate 51. A first dielectric layer of predetermined dielectric material (e.g., $SiO_2$) is then formed on the well regions 54, 54a of first conductivity type, by deposition of the dielectric material onto the face or thermal oxidation of the face, for example. Then, a first layer of conductive material such as doped polycrystalline silicon is deposited on the first dielectric layer. The layers of conductive material and dielectric material are then patterned using conventional techniques to form an insulated first capacitor electrode 59, on a first capacitor electrode insulating region 55 and form a gate electrode 61 of an insulated-gate field effect transistor, on a gate insulating region 57.

Referring now to FIG. 4, sidewall insulating spacers 60 are then formed on edges of the patterned first capacitor electrode 59 and opposing ends of the insulated gate electrode 61. Self-aligned source and drain regions 62 for the insulated-gate field effect transistor and inversion-layer charge source regions 63 for the decoupling capacitor are then preferably formed in the well regions 54, 54a of first conductivity type by implanting second conductivity type dopants (e.g., N-type), using the insulating spacers as a mask. A first conductivity type contact region 64 (e.g., P+) may also be formed in the well region 54 to facilitate maintaining the well region 54 at a predetermined potential. An electrically insulating layer (e.g., $SiO_2$) and patterned word line 65 for the memory cell are then formed, using conventional techniques. Another electrically insulating layer (e.g., $SiO_2$) is then deposited conformally across the surface of the substrate 51 to form a first isolation region 67. The first isolation region 67 is then selectively etched back using conventional photolithographic patterning techniques to form a first electrically insulating layer 69 on the insulated first capacitor electrode 59 and on the well region 54.

Figure 5:
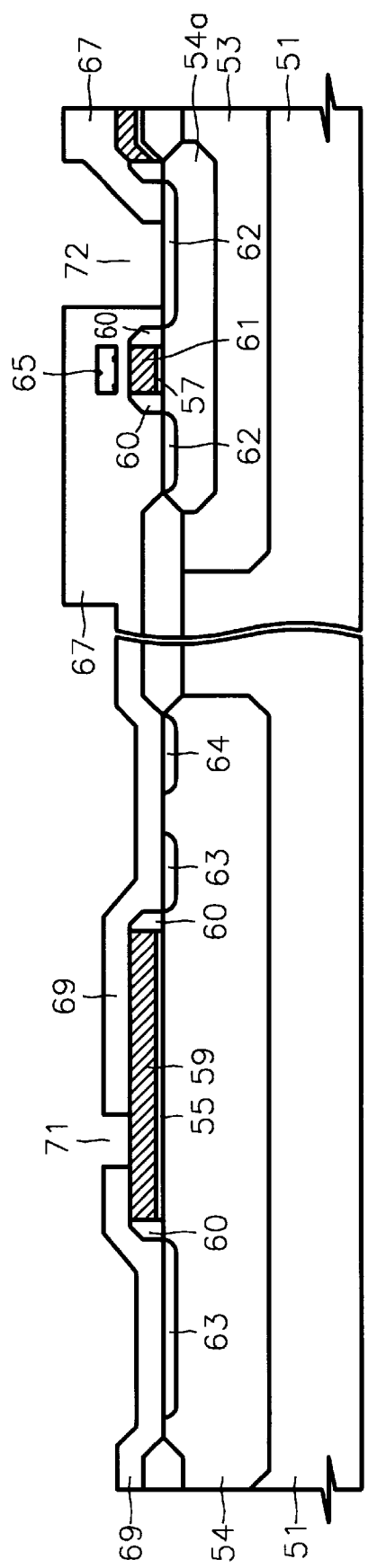
Figure 6:
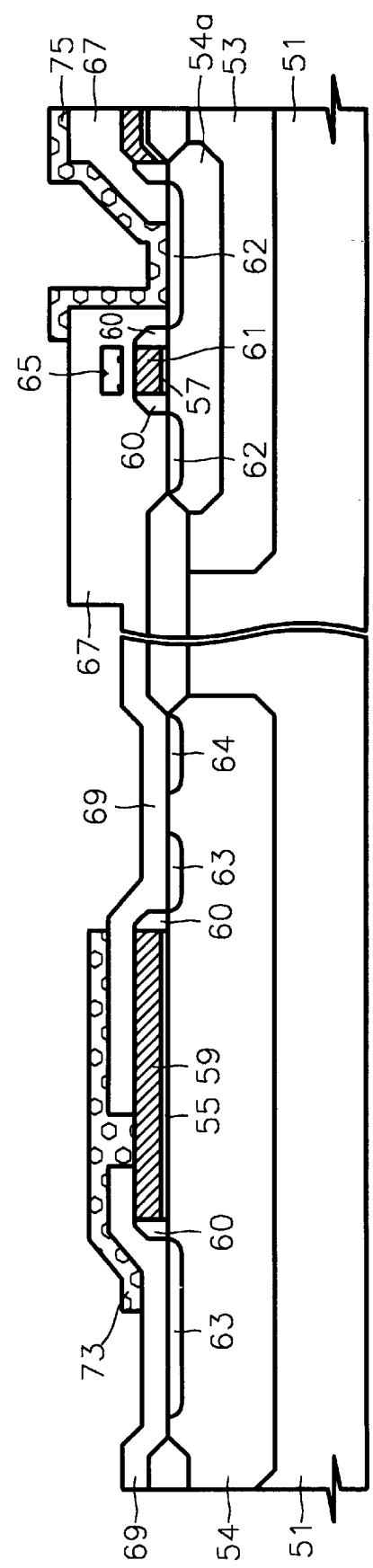

Referring now to FIGS. 5–6, a first via or contact hole 71 is then formed in the first electrically insulating layer 69 to expose a portion of the upper surface of the first capacitor electrode 59. Simultaneously with this step, a second contact hole 72 is formed in the first isolation region 67 to expose the source/drain region 62 of the insulated-gate field effect transistor. A second conductive layer, such as a doped polycrystalline silicon layer, is then deposited on the first electrically insulating layer 69 and in the first and second contact holes 71 and 72. The second conductive layer is then patterned using conventional techniques to form a second capacitor electrode 73 and gate electrode 75 of a thin-film transistor (TFT), which is connected to the drain/source region 62 of the insulated-gate field effect transistor.

Figure 7:
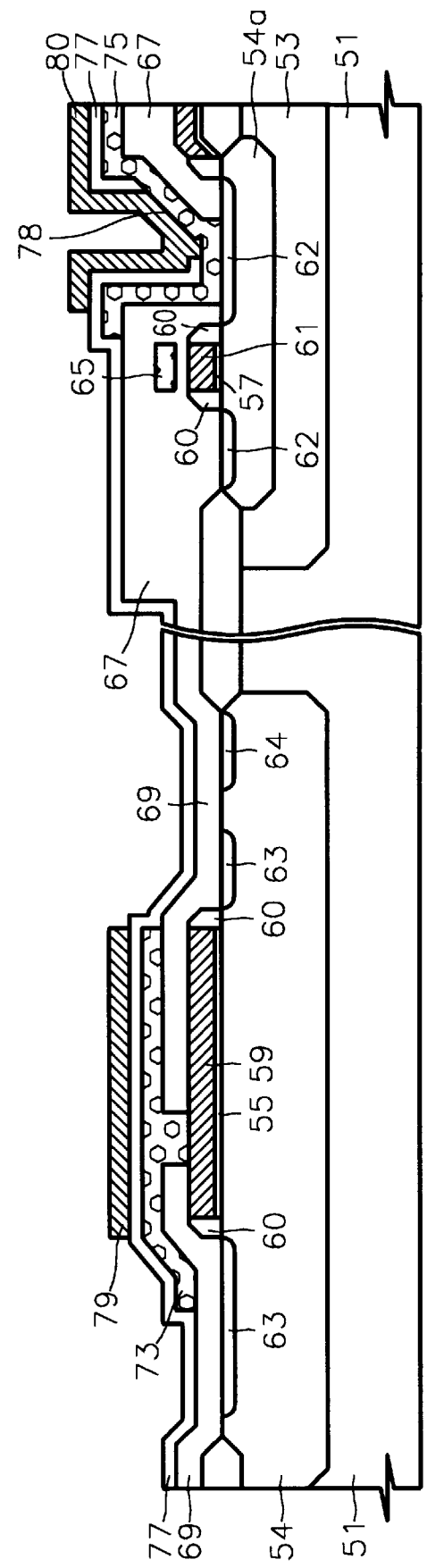

Referring now to FIG. 7, a second dielectric layer 77 of predetermined dielectric material (e.g., $SiO_2$, $Si_3N_4$) is then deposited on the first electrically insulating layer 69, second capacitor electrode 73, thin-film transistor gate electrode 75 and first isolation region 67, as illustrated. A contact opening 78 is then formed in the second dielectric layer 77 to expose the gate electrode 75 of the thin-film transistor. A third conductive layer, such as doped polycrystalline or amorphous silicon (a-Si) is then deposited and patterned as a third capacitor electrode 79 and source/drain region 80 of the thin-film transistor.

Figure 8:
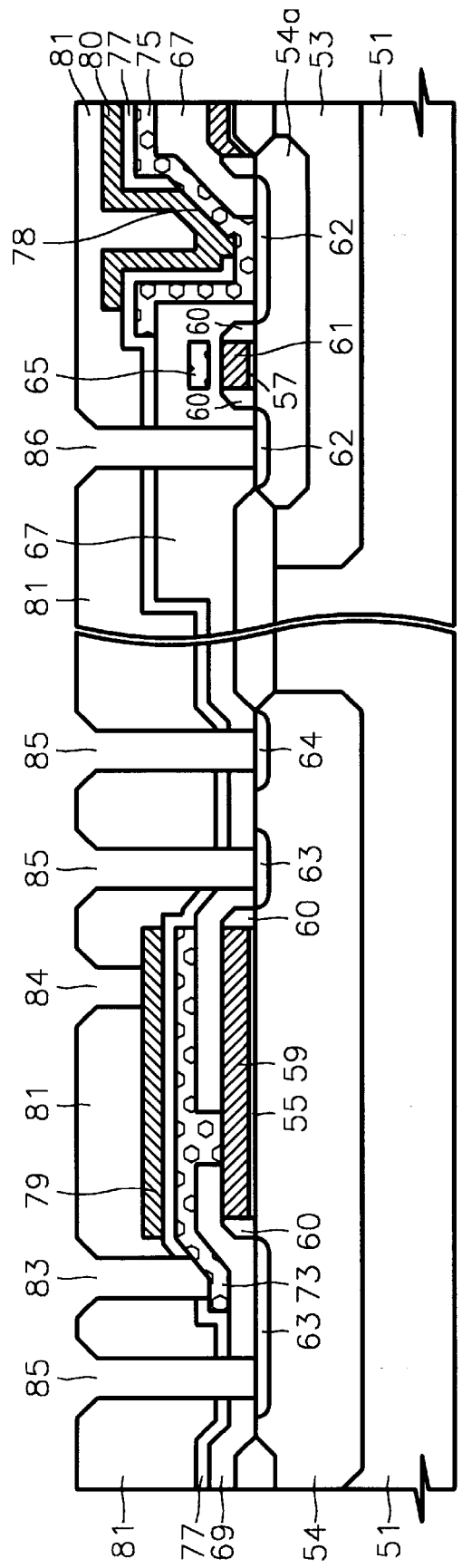
Figure 9:
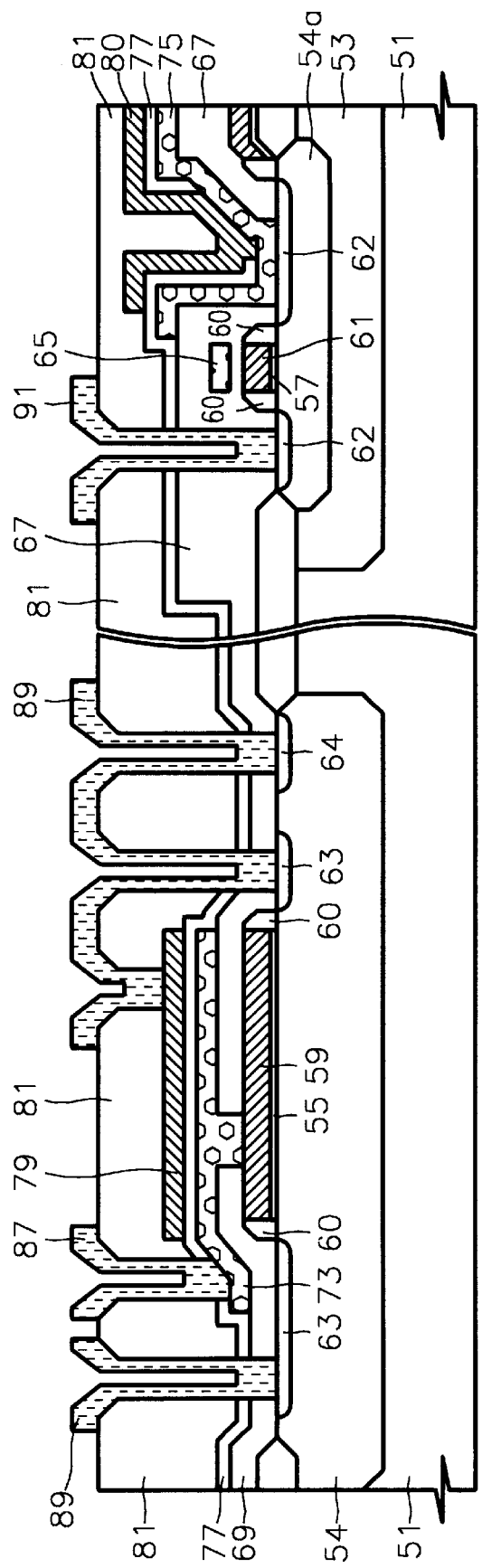

Referring now to FIGS. 8–9, a blanket second electrically insulating layer 81 (e.g., $SiO_2$) is then deposited, and patterned to form openings 84, 85 to the inversion-layer charge source regions 63, third capacitor electrode 79 and first conductivity type contact region 64, as illustrated. The second electrically insulating layer 81 is also patterned to form openings 83, 86 to the second capacitor electrode 73 and source/drain region 62 of the insulated-gate field effect transistor, respectively. Metallization is then deposited on the second electrically insulating layer 81 and in the openings and then patterned to form a first capacitor contact 87, second capacitor contact 89 and source/drain contact 91 to the insulated-gate field effect transistor in the static random-access memory cell.

Figure 10:
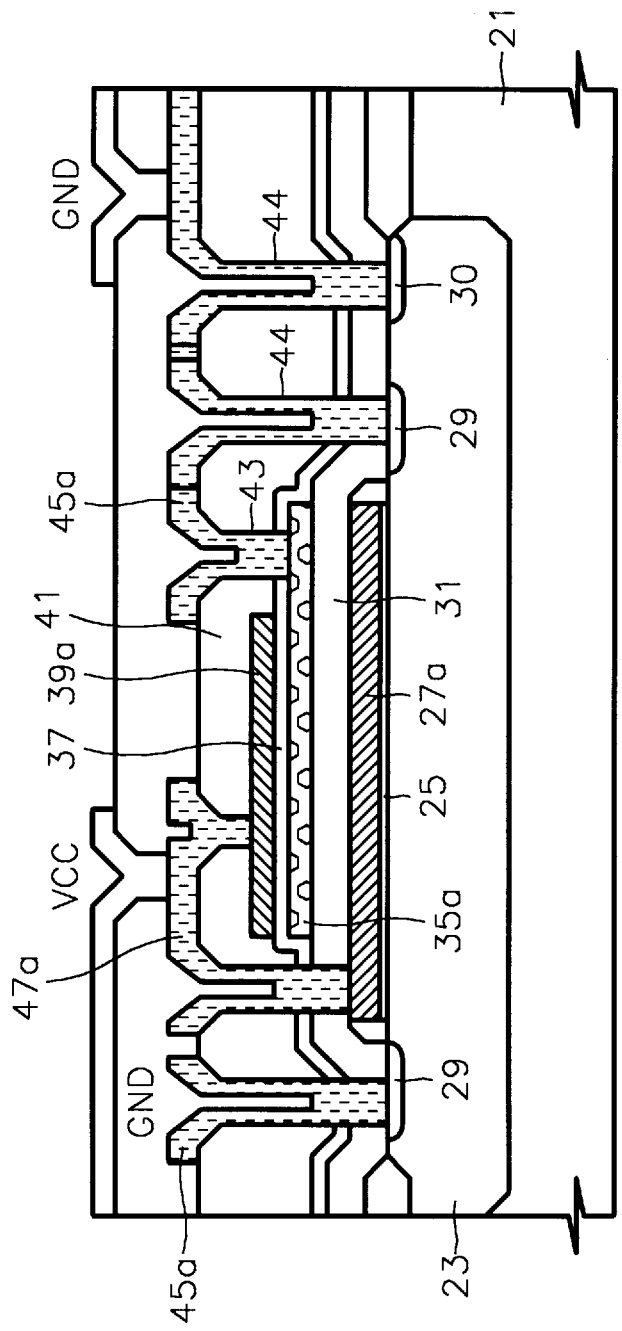
FIG. 10 illustrates a schematic cross-sectional view of an integrated decoupling capacitor according to a second embodiment of the present invention.

Referring now to FIG. 10, an integrated decoupling capacitor according to a second embodiment of the present invention, will be described. According to this second embodiment, an integrated decoupling capacitor comprises a semiconductor substrate 21 of first or second conductivity type and a diffused well region 23 of first conductivity type (e.g., P-type) therein extending to a first portion of a face of the semiconductor substrate 21, defined by an opening in a field oxide isolation region. An insulated first capacitor electrode 27a is provided on the first portion of the face. The first capacitor electrode 27a is preferably electrically insulated from the face by a first dielectric layer 25 of predetermined dielectric material. A first electrically insulating layer 31 is provided on an upper surface of the first capacitor electrode 27a. A second capacitor electrode 35a is also provided on the first electrically insulating layer 31, opposite the first capacitor electrode 27a.

A third capacitor electrode 39a is also patterned opposite the second capacitor electrode 35a and is separated therefrom by a second dielectric layer 37 of predetermined dielectric material (e.g., $SiO_2$, $Si_3N_4$). The third capacitor electrode 39a is electrically insulated from upper levels of metallization by a second electrically insulating layer 41. A first capacitor contact 47a (e.g., VCC) is also provided by patterning metallization in a first via which extends through the second electrically insulating layer 41, second dielectric layer 37 and first electrically insulating layer 31 to expose an upper surface of the first capacitor electrode 27a. A fourth via which extends through the second electrically insulating layer 41 to expose an upper surface of the third capacitor electrode 39a is also provided to electrically connect the first and third capacitor electrodes 27a, 39a together, via the first capacitor contact 47a. A second capacitor contact 45a (e.g., GND) is also provided by patterning metallization in third and fourth vias 43 and 44, respectively. Here, the third via 43 extends through the second electrically insulating layer 41 and second dielectric layer 37 to expose an upper surface of the second capacitor electrode 35a and the fourth via 44 extends through the second electrically insulating layer 41, the second dielectric layer 37 and the first electrically insulating layer 31 to expose the inversion-layer charge source regions 29 of second conductivity type. As illustrated, metallization is also patterned in the fourth via 44 to electrically connect the first conductivity type contact region 30 to the second capacitor contact 45a.

The method of forming the integrated decoupling capacitor of FIG. 10 is essentially identical to the method illustrated by FIGS. 3–9. However, the step of opening a first via 71 (33) in the first electrically insulating layer 69 (31), as illustrated best by FIG. 5, is eliminated. Instead, the second insulating layer 41 is patterned to define first and fourth vias so that the first capacitor contact 47a electrically connects the first and third capacitor electrodes 27a, 39a. The second insulating layer 41 is also patterned to define second and third vias so that the second capacitor contact 45a electrically connects the second capacitor electrode 35a to the inversion-layer channel source regions 29.

Referring now to FIGS. 11–16, a method of simultaneously forming an integrated decoupling capacitor and static random-access memory (RAM) cell according to a preferred third embodiment of the present invention, will be described. According to this third embodiment, an integrated decoupling capacitor comprises a semiconductor substrate 101 of first or second conductivity type and a diffused well region 103 of first conductivity type (e.g., P-type) therein extending to a first portion of a face of the semiconductor substrate 101, defined by an opening in a field oxide isolation region. An insulated first capacitor electrode 107 is provided on the first portion of the face. The first capacitor electrode 107 is preferably electrically insulated from the face by a first dielectric layer 105 of predetermined dielectric material. A second dielectric layer 109 is provided on an upper surface of the first capacitor electrode 107.

A second capacitor electrode 111 is also provided on the second dielectric layer 109. To achieve high levels of integration, the second capacitor electrode 111 is patterned opposite the first capacitor electrode 107. The second capacitor electrode 111 is electrically insulated from upper levels of metallization by an electrically insulating layer 117. A first capacitor contact 115 (e.g., VCC) is also provided by patterning metallization in a via which extends through the electrically insulating layer 117 and exposes an upper surface of the first capacitor electrode 107. A second capacitor contact 113 (e.g., GND) is also provided by patterning metallization in vias which expose an upper surface of the second capacitor electrode 111, the inversion-layer charge source region and first conductivity type contact region.

Based on the illustrated vertical or "stacked" arrangement of the first and second capacitor electrodes, the application of a predetermined potential bias to the first capacitor electrode 107 will cause (i) the formation of an inversion-layer channel of second conductivity type charge carriers (e.g., electrons) in the region 103 of first conductivity type at the face, opposite the first capacitor electrode 107; and (ii) the formation of a density of second conductivity type charge carriers on the second capacitor electrode 111, if the second capacitor contact 113 is maintained at ground potential (GND), as illustrated. Thus, the formation of the first and second capacitor electrodes in stacked vertical relationship, as illustrated, essentially doubles the area and effective capacitance of the integrated decoupling capacitor, relative to the prior art decoupling capacitor of FIG. 1. Moreover, as explained more fully hereinbelow, the decoupling capacitor of FIG. 11 can also be formed simultaneously with the formation of active devices of an integrated circuit such as a memory cell, without requiring additional process steps.

Figure 11:
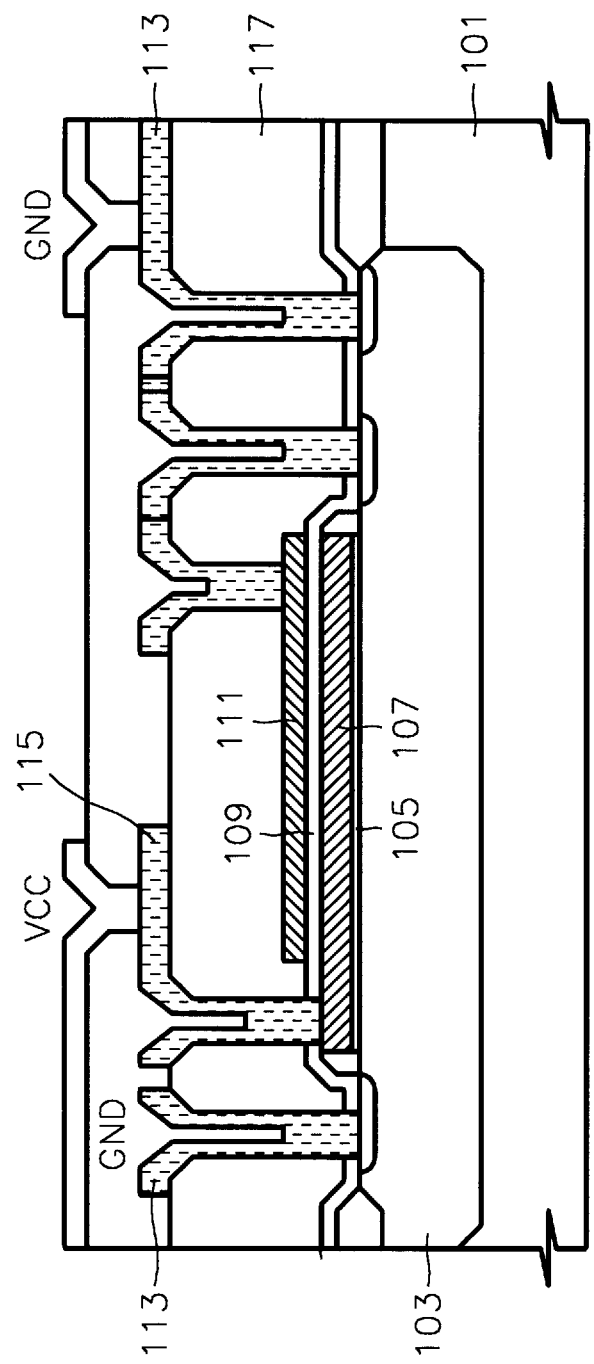
FIG. 11 illustrates a schematic cross-sectional view of an integrated decoupling capacitor according to a third embodiment of the present invention.

The preferred steps of forming the decoupling capacitor of FIG. 11 in conjunction with a static random-access memory cell, will now be described. In particular, FIG. 12 illustrates the steps of forming diffused well regions 124, 124a of first conductivity type at separate spaced locations in a semiconductor substrate 121 of first or second conductivity type. These well regions 124, 124a may be formed by implanting and diffusing first conductivity type dopants into a face of the semiconductor substrate 121, using a previously formed field oxide isolation region as an implant mask. As illustrated, the diffused well region 124a of first conductivity type may be formed by implanting and diffusing dopants of first conductivity type into a well region 123 of second conductivity type, at an exposed portion of the face of the substrate 121. A first dielectric layer of predetermined dielectric material (e.g., $SiO_2$) is then formed on the well regions 124, 124a of first conductivity type, by deposition of the dielectric material onto the face or thermal oxidation of the face, for example. Then, a first layer of conductive material such as doped polycrystalline silicon is deposited on the first dielectric layer. The layers of conductive material and dielectric material are then patterned using conventional techniques to form an insulated first capacitor electrode 129, on a first capacitor electrode insulating region 125 and form a gate electrode 131 of an insulated-gate field effect transistor, on a gate insulating region 127.

Referring now to FIG. 13, self-aligned source and drain regions 132 for the insulated-gate field effect transistor and inversion-layer charge source regions 133 for the decoupling capacitor are then preferably formed by implanting second conductivity type dopants into the well regions 124, 124a of first conductivity type. A first conductivity type contact region 134 (e.g., P+) may also be formed in the well region 124 to facilitate maintaining the well region 124 at a predetermined potential. An electrically insulating layer (e.g., $SiO_2$) and patterned word line 135 for the memory cell are then formed, using conventional techniques. Another electrically insulating layer (e.g., $SiO_2$) is then deposited conformally across the surface of the substrate 121 to form a first isolation region 137. The first isolation region 137 is then selectively removed using conventional techniques to form a substrate insulating layer 139 and expose an upper surface of the first capacitor electrode 129. A contact hole 140 is then formed in the first isolation region 137. A second conductive layer, such as a doped polycrystalline silicon layer, is then deposited and patterned on the first isolation region 137 and in the contact hole 140, to form a gate electrode 141 of a thin-film transistor (TFT), which is connected to the drain/source region 132 of the insulated-gate field effect transistor.

Figure 14:
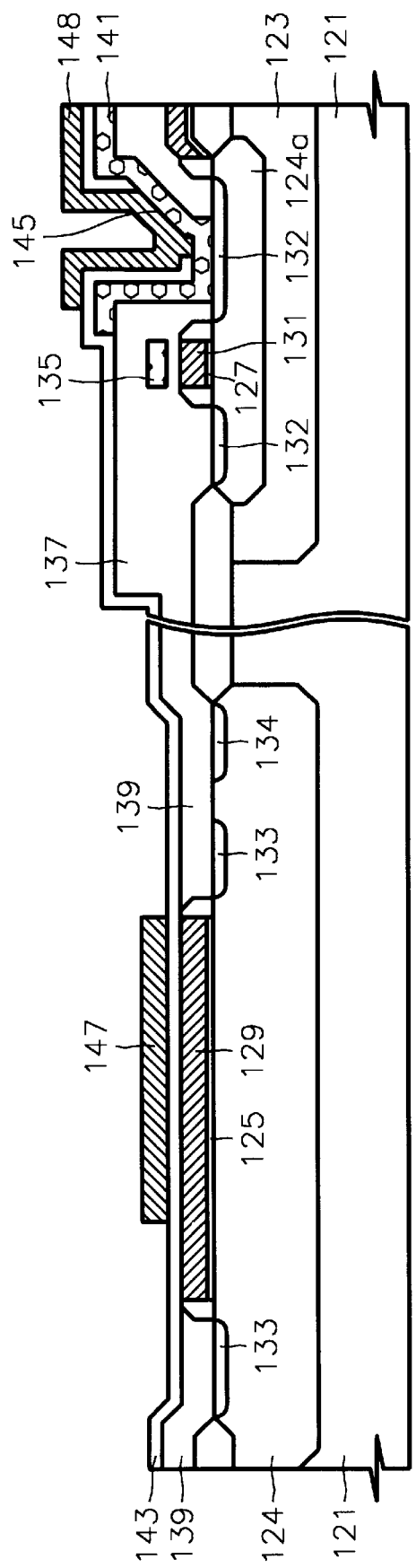
Figure 15:
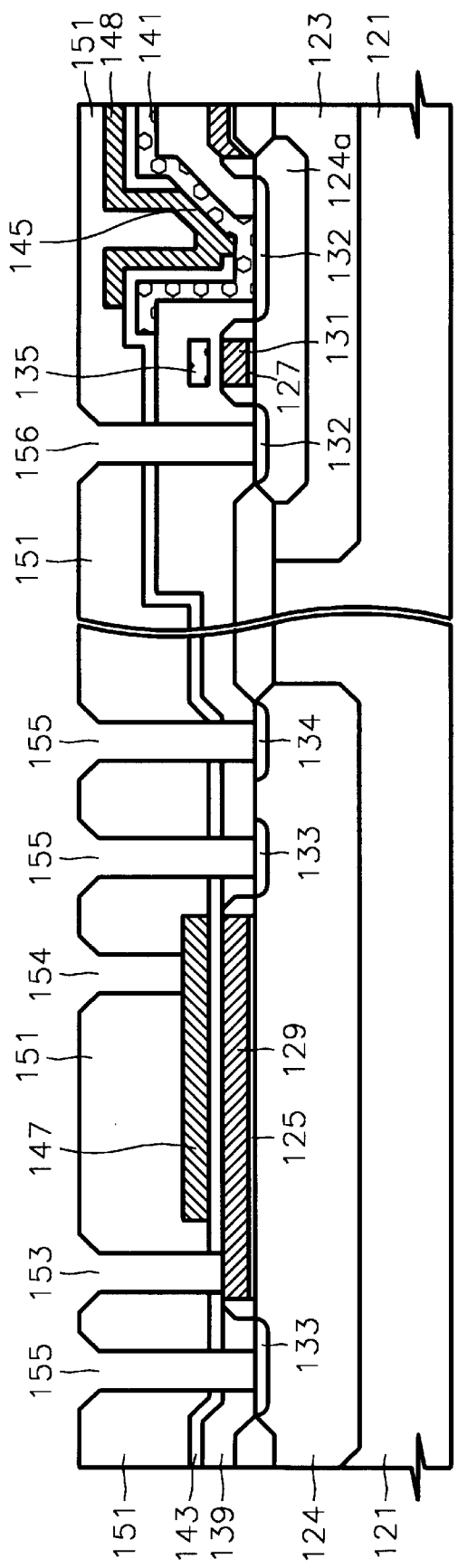
Figure 16:
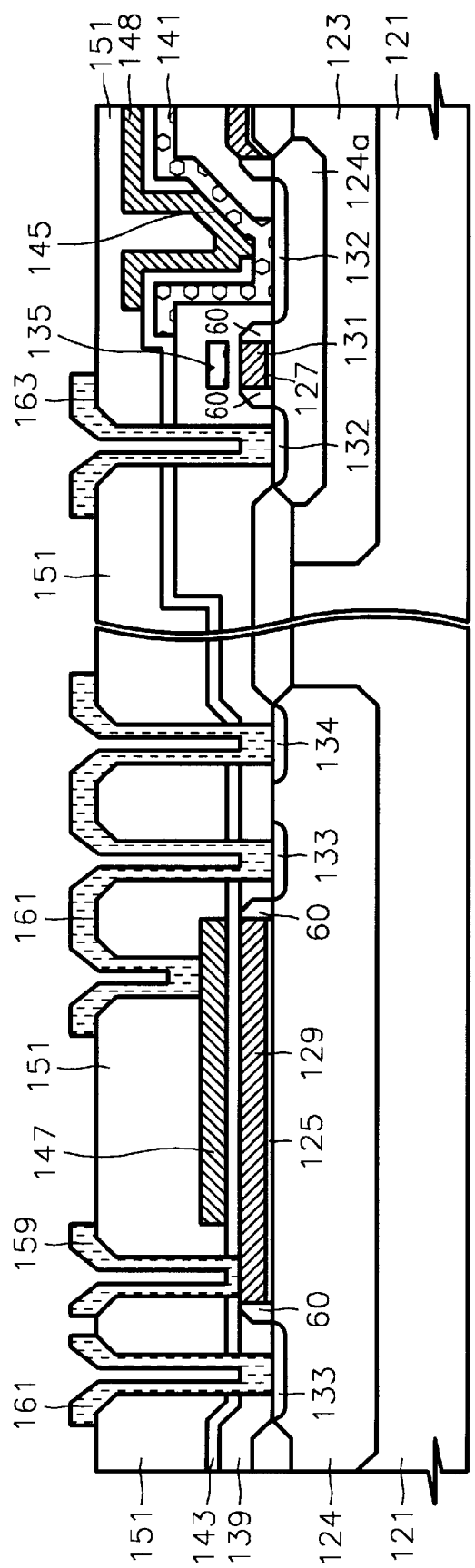

Referring now to FIG. 14, a first dielectric layer 143 of predetermined dielectric material (e.g., $SiO_2$, $Si_3N_4$) is then deposited, as illustrated. A contact opening 145 is then formed in the second dielectric layer 143 to expose the gate electrode 141 of the thin-film transistor. A third conductive layer, such as doped polycrystalline or amorphous silicon (a-Si) is then deposited and patterned as a second capacitor electrode 147 and source/drain region 148 of the thin-film transistor. A blanket electrically insulating layer 151 (e.g., $SiO_2$) is then deposited, and patterned to form openings 153–156 to the first capacitor electrode 129, second capacitor electrode 147, inversion-layer charge source regions 133, first conductivity type contact region 64 and source/drain region 132 of the insulated-gate field effect transistor, as illustrated by FIG. 15. Metallization is then deposited on the electrically insulating layer 151 and in the openings and patterned to form a first capacitor contact 159, second capacitor contact 161 and source/drain contact 163 to the insulated-gate field effect transistor in the static random-access memory cell, as illustrated by FIG. 16.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated decoupling capacitor, comprising the steps of:
   forming an insulated first capacitor electrode on a first portion of a face of a semiconductor substrate containing a region of first conductivity type therein extending to the first portion of the face;
   forming a second capacitor electrode on the insulated first capacitor electrode, disposed opposite the region of first conductivity type at the first portion of the face;
   forming an inversion-layer charge source region of second conductivity type in the region of first conductivity type;
   forming a first conductivity type contact region in the region of first conductivity type;
   forming a first capacitor contact electrically connected to the insulated first capacitor electrode; and
   forming a second capacitor contact electrically connected to the second capacitor electrode, the first conductivity type contact region and the inversion-layer charge source region.

2. The method of claim 1, wherein the second capacitor contact is electrically connected to the inversion-layer charge source region and the first conductivity type contact region, at the face.

3. The method of claim 2, wherein the first conductivity type contact region forms a P+/P junction with the region of first conductivity type.

4. The method of claim 3, wherein the semiconductor substrate is of second conductivity type; and wherein the region of first conductivity type therein comprises a diffused well region of first conductivity type extending to the face.

5. The method of claim 1, wherein said step of forming an insulated first capacitor electrode comprises the steps of:
   forming a first dielectric layer on the first portion of the face;
   forming a first capacitor electrode on the first dielectric layer, opposite the first portion of the face; and
   forming a second dielectric layer on the first capacitor electrode, opposite the first dielectric layer.

6. The method of claim 5, wherein said first capacitor contact forming step comprises the steps of forming a first via in the second dielectric layer; and patterning metallization in the first via.

7. The method of claim 6, further comprising the step of forming an electrically insulating layer on the second capacitor electrode, opposite the second dielectric layer; and wherein said second capacitor contact forming step comprises the steps of forming a second via in the electrically insulating layer; and patterning metallization in the second via.

8. The method of claim 7, wherein said second capacitor contact forming step comprises the steps of forming a third via in the electrically insulating layer and second dielectric layer to expose the inversion-layer charge source region at the face; and patterning metallization in the third via.

9. The method of claim 3, wherein said step of forming an insulated first capacitor electrode comprises the steps of:
   forming a first dielectric layer on the first portion of the face;
   forming a first capacitor electrode on the first dielectric layer, opposite the first portion of the face; and
   forming a second dielectric layer on the first capacitor electrode, opposite the first dielectric layer.

10. The method of claim 9, wherein said first capacitor contact forming step comprises the steps of forming a first via in the second dielectric layer; and patterning metallization in the first via.

11. The method of claim 10, further comprising the step of forming an electrically insulating layer on the second capacitor electrode, opposite the second dielectric layer; and wherein said second capacitor contact forming step comprises the steps of forming a second via in the electrically insulating layer; and patterning metallization in the second via.

12. The method of claim 11, wherein said second capacitor contact forming step comprises the steps of forming a third via in the electrically insulating layer and second dielectric layer to expose the inversion-layer charge source region at the face; and patterning metallization in the third via.

13. The method of claim 12, wherein said second capacitor contact forming step comprises the steps of forming a fourth via in the electrically insulating layer and second dielectric layer to expose the first conductivity type contact region; and patterning metallization in the fourth via.

14. The method of claim 11, wherein said second capacitor contact forming step comprises the steps of forming a third via in the electrically insulating layer to expose the inversion-layer charge source region at the face; and patterning metallization in the third via.

15. The method of claim 14, wherein said second capacitor contact forming step comprises the steps of forming a fourth via in the electrically insulating layer to expose the first conductivity type contact region; and patterning metallization in the fourth via.

16. The method of claim 1, wherein said step of forming an insulated first capacitor electrode comprises the steps of:
   forming a layer of first dielectric material on the first portion of the face;
   forming a polycrystalline silicon layer of second conductivity type on the layer of first dielectric material, opposite the first portion of the face;
   patterning the polycrystalline silicon layer of second conductivity type and layer of first dielectric material, to expose the portion of the face;
   forming insulating sidewall spacers on exposed ends of the patterned polycrystalline silicon layer; and
   forming a second dielectric layer on the patterned polycrystalline silicon layer, opposite the patterned layer of first dielectric material.

17. The method of claim 16, wherein said inversion-layer charge source region forming step comprises implanting dopants of second conductivity type into the region of first conductivity type, using the insulated first capacitor electrode as an implant mask.

18. A method of forming an integrated decoupling capacitor, comprising the steps of:
   forming an insulated first capacitor electrode on a first portion of a face of a semiconductor substrate containing a region of first conductivity type therein extending to the first portion of the face;
   forming a first electrically insulating layer on the insulated first capacitor electrode, opposite the first portion of the face;
   forming a second capacitor electrode on the first electrically insulating layer, opposite the first capacitor electrode;
   forming a third capacitor electrode on the second capacitor electrode, opposite the first capacitor electrode;
   forming an inversion-layer charge source region of second conductivity type in the region of first conductivity type;

forming a first conductivity type contact region in the region of first conductivity type:

forming a first capacitor contact electrically coupled to the first capacitor electrode; and forming a second capacitor contact electrically connected to the inversion-layer charge source region, the first conductivity type contact region and the second or third capacitor electrode.

19. The method of claim 18, wherein the second capacitor electrode is electrically connected to the first capacitor electrode; and wherein said first capacitor contact forming step comprises forming a first capacitor contact electrically connected to the second capacitor electrode.

20. The method of claim 19, further comprising the step of forming a first via in the first electrically insulating layer to expose the first capacitor electrode; and wherein said second capacitor electrode forming step comprises forming a second capacitor electrode on the first electrically insulating layer and in the first via to thereby contact the first capacitor electrode.

21. The method of claim 20, wherein said third capacitor electrode forming step is preceded by the step forming a layer of dielectric material on the second capacitor electrode, opposite the first capacitor electrode.

22. The method of claim 21, wherein said first capacitor contact forming step is preceded by the steps of forming a second via in the layer of dielectric material to expose the second capacitor electrode; and forming a third via in the layer of dielectric material and the first electrically insulating layer to expose the inversion-layer charge source region at the face.

23. The method of claim 22, wherein said first capacitor contact forming step comprises patterning metallization in the second via; and wherein said second capacitor contact forming step comprises patterning metallization in the third via.

24. The method of claim 23, wherein said steps of forming second and third vias are performed simultaneously and wherein said steps of patterning metallization in the second and third vias are performed simultaneously.

25. The method of claim 24, wherein said steps of forming second and third vias are preceded by the step of forming a second electrically insulating layer on the layer of dielectric material and on the third electrode.

26. The method of claim 25, wherein said step of forming a second via comprises forming a second via in the second electrically insulating layer and in the layer of dielectric material to expose the second capacitor electrode; and wherein said step of forming a third via comprises forming a third via in the second electrically insulating layer, the layer of dielectric material and the first electrically insulating layer to expose the inversion-layer charge source region at the face.

27. The method of claim 26, wherein said step of forming a third via comprises forming a fourth via in the second electrically insulating layer to expose the third capacitor electrode; and wherein said second capacitor contact forming step comprises patterning metallization in the fourth via.

28. The method of claim 18, wherein the third capacitor electrode is electrically connected to the first capacitor electrode; and wherein said first capacitor contact forming step comprises forming a first capacitor contact electrically connected to the first capacitor electrode and third capacitor electrode.

29. The method of claim 28, further comprising the step of forming a first via in the first electrically insulating layer to expose the first capacitor electrode; and wherein said first capacitor contact forming step comprises patterning metallization in the first via.

30. The method of claim 29, wherein said third capacitor electrode forming step is preceded by the step forming a layer of dielectric material on the second capacitor electrode, opposite the first capacitor electrode.

31. The method of claim 30, wherein said second capacitor contact forming step is preceded by the steps of forming a second via in the layer of dielectric material to expose the second capacitor electrode; and forming a third via in the layer of dielectric material and the first electrically insulating layer to expose the inversion-layer charge source region at the face.

32. The method of claim 31, wherein said second capacitor contact forming step comprises patterning metallization in the second and third vias.

33. The method of claim 32, wherein said steps of forming second and third vias are preceded by the step of forming a second electrically insulating layer on the layer of dielectric material and on the third capacitor electrode.

34. The method of claim 33, wherein said step of forming a second via comprises forming a second via in the second electrically insulating layer and in the layer of dielectric material to expose the second capacitor electrode; and wherein said step of forming a third via comprises forming a third via in the second electrically insulating layer, the layer of dielectric material and the first electrically insulating layer to expose the inversion-layer charge source region at the face.

35. The method of claim 34, wherein said step of forming a first via comprises the step of forming a fourth via in the second electrically insulating layer to expose the third capacitor electrode; and wherein said first capacitor contact forming step comprises patterning metallization in the first and fourth vias.

* * * * *